United States Patent
Heremans et al.

(10) Patent No.: US 6,318,901 B1
(45) Date of Patent: Nov. 20, 2001

(54) SOCKET AND A SYSTEM FOR OPTOELECTRONIC INTERCONNECTION AND A METHOD OF FABRICATING SUCH SOCKET AND SYSTEM

(75) Inventors: Paul Heremans, Leuven; Gustaaf Borghs, Kessel-Lo; Maarten Kuijk, Antwerp; Roger Vounckx, Schaarbeek, all of (BE)

(73) Assignee: IMEC (BE)

( * ) Notice: Subject to any disclaimer, the term of this patent is extended or adjusted under 35 U.S.C. 154(b) by 0 days.

(21) Appl. No.: 09/360,504

(22) Filed: Jul. 26, 1999

(30) Foreign Application Priority Data

Jul. 28, 1998 (EP) ................................. 988701645

(51) Int. Cl.⁷ ....................................... G02B 6/36
(52) U.S. Cl. ................................. 385/53; 385/89
(58) Field of Search ................... 385/53, 89, 88, 385/92, 49, 14, 93, 94, 2

(56) References Cited

U.S. PATENT DOCUMENTS

| | | | |
|---|---|---|---|
| 5,074,683 | 12/1991 | Tarn et al. | 385/120 |
| 5,093,879 | 3/1992 | Bregman et al. | 385/93 |
| 5,221,984 | * 6/1993 | Furuyama et al. | 385/89 X |
| 5,367,593 | 11/1994 | Lebby et al. | 385/53 |
| 5,578,162 | 11/1996 | D'Asaro et al. | 156/630.1 |
| 5,579,426 | 11/1996 | Li et al. | 385/88 |
| 5,631,988 | 5/1997 | Swirhun et al. | 385/89 |
| 5,652,811 | 7/1997 | Cook et al. | 385/14 |

FOREIGN PATENT DOCUMENTS 0 458 608 A1   5/1991   (EP).

OTHER PUBLICATIONS

European search report. Jan. 21, 1999.
P. Marsh. "The Right Track." New Electronics, Jul. 8, 1997. pp. 19–20.
Y. Kobayashi, et al. "Improvement of Coupling Efficiency for Passive Alignment of Stacked Multifiber Tapes to a Vertical–Cavity Surface–Emitting Laser Array." Japanese Journal of Applied Physics. Mar. 1997. pp. 1872–1875.
H. Kosaka. "VCSEL and Its Applications for Optical Interconnection and Switch." Abstract of the 1997 International Conference on Solid State Devices and Materials. pp. 58–59.

* cited by examiner

Primary Examiner—Phan T. H. Palmer
(74) Attorney, Agent, or Firm—Knobbe, Martens, Olson & Bear, LLP

(57) ABSTRACT

It is an object of the present invention to disclose a socket that is easy in use for optoelectrical interconnection. The socket of the invention can be handled as a compact device that allows the interconnection between electrical signals and external apparatus for transmitting the optical signals, preferably via a high density of optical channels. The socket of the invention has features and markers for attachment and alignment of optical transfer media such as optical fibers, optical fiber bundles and optical imaging fiber bundles. The alignment features and markers allow to align the optical transfer media to the connection for electrical signals. The markers can be integrated in or can be provided on a fiber optic face plate substrate forming part of the socket.

40 Claims, 13 Drawing Sheets

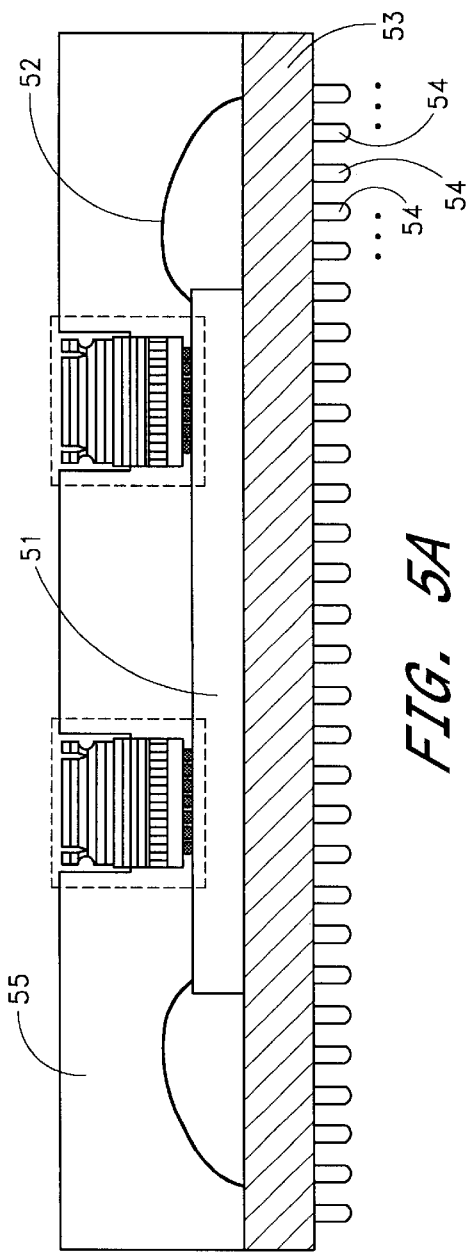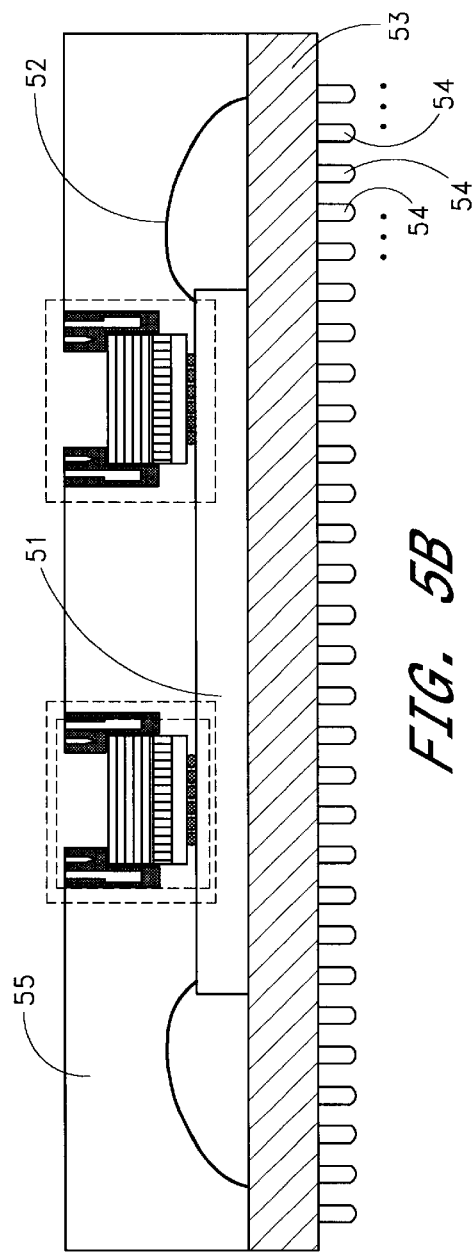

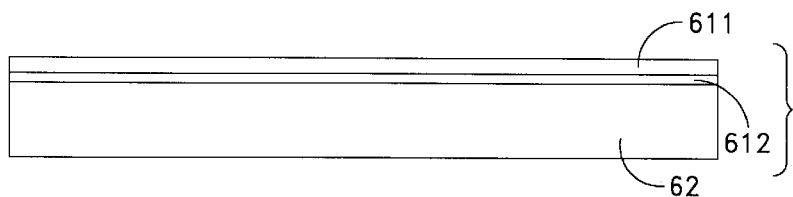
FIG. 6A
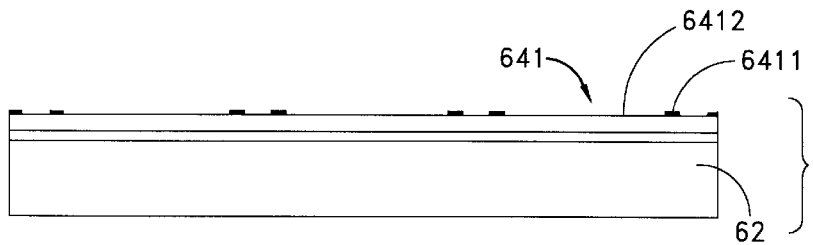
FIG. 6B
FIG. 6C
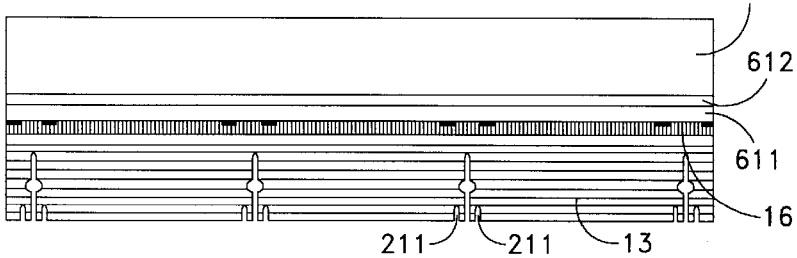
FIG. 6D
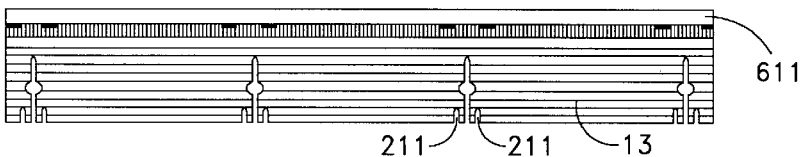
FIG. 6E
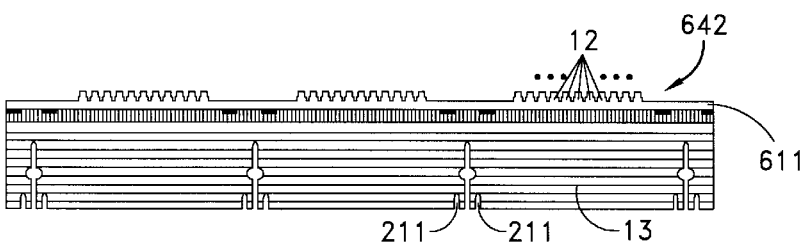
FIG. 6F
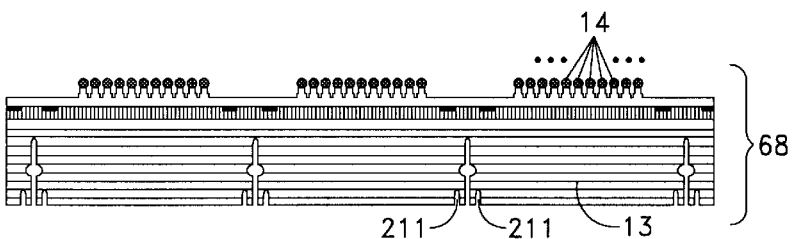
FIG. 6G
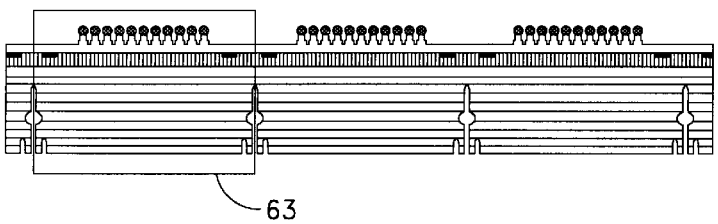

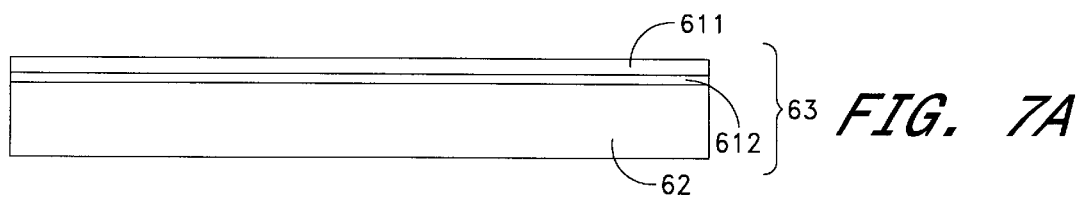
FIG. 7A
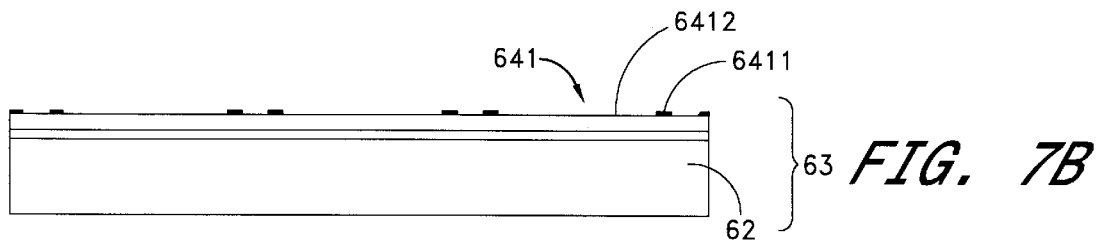
FIG. 7B
FIG. 7C
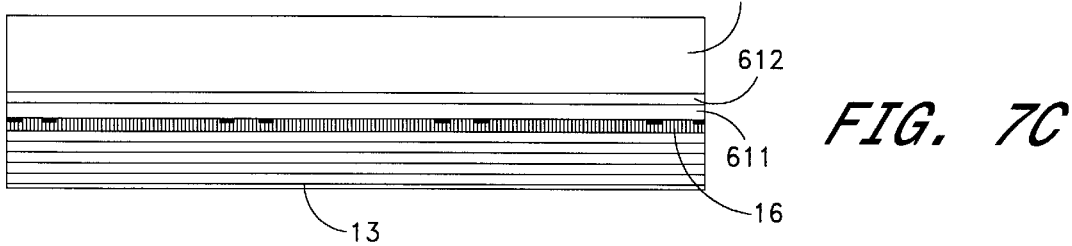
FIG. 7D
FIG. 7E
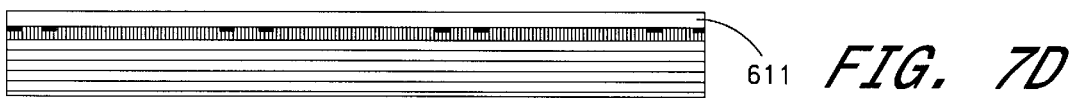
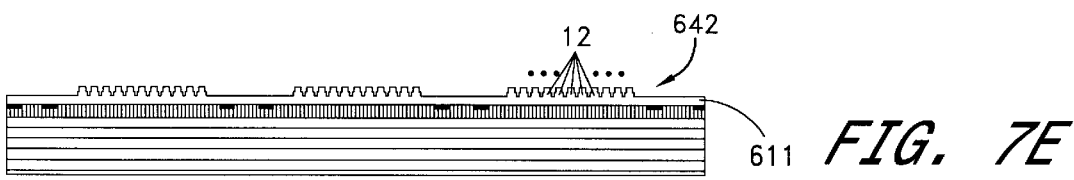
FIG. 7F
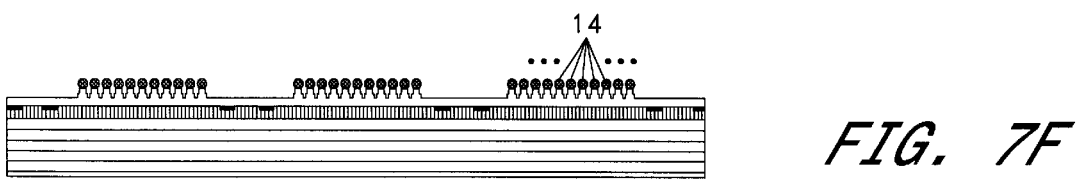
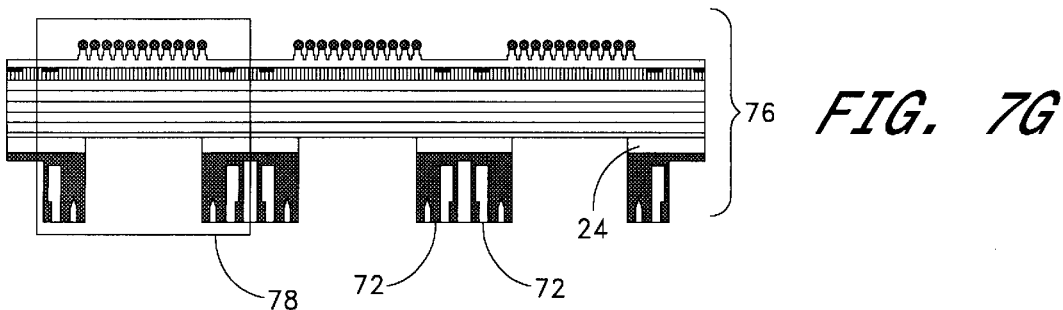
FIG. 7G

SOCKET AND A SYSTEM FOR OPTOELECTRONIC INTERCONNECTION AND A METHOD OF FABRICATING SUCH SOCKET AND SYSTEM

FIELD OF THE INVENTION

The present invention relates to the field of semiconductor device structures, and more in particular to optoelectrical or optoelectronic devices. More precisely the present invention is related to a socket, and to a system for optoelectronic interconnection. The present invention is also related to a method of fabricating such sockets and such systems.

BACKGROUND OF THE INVENTION

The increased integration of transistors on single chips made possible by the submicron CMOS technology raises the problem of speed and performance limitation of electronic systems through the interconnect structures between chips or with other structures. A possible solution to this problem of CMOS interconnect bottlenecks could be the use of optical links or interconnects between chips. In a number of applications, especially to achieve high density interconnects, optical interconnects are advantageous over electrical interconnects. For instance, optical interconnects can reach a higher interconnect density and lower power consumption than electrical interconnects.

In order to achieve high density optical interconnects, it is necessary to realize high density arrays of light sources and light detectors, and furthermore to use an optical path or channel between sources and detectors which sustains a high density of optical channels. The light sources used to send the optical signals through the optical interconnect channels receive their input and possibly at least part of their power from electrical signals. These electrical signals can originate from an integrated circuit, or from a board. Furthermore, at the other end of the optical interconnect channel are detectors, which also require electrical power to operate, and which convert the received optical signals into electrical signals. Hence, it is clear that high density optical interconnects require a high density of electrical or optical devices to possibly deliver at least part of the required electrical power to run the optical interconnect, as well as to send and retrieve the signals.

Obviously, the foregoing analysis can be applied as well to interconnect systems that make use of another form of electromagnetic radiation than light.

In many optical applications, it is required to have a transparent substrate for an optoelectronic device such as a light-emitting device, a photodetector, a modulator or a CCD sensor. An application example is when an optoelectronic device is contacted from the front side by flip-chip mounting, while the light has to be transported through the substrate. Many substrates are poorly or not transparent for the light emitted or detected in the active semiconductor layers grown on them. For example, Gallium-Arsenide (GaAs) or Aluminium-Gallium-Arsenide (AlGaAs) or InGaP or InAlGaP active layers emit and detect light with a peak wavelength that is strongly absorbed by the GaAs substrate on which they are typically grown. Hence, light-emission or light-detection through the original substrate is not possible. A possible solution to this problem is to remove the original substrate in a process such as described in U.S. Pat. No. 5,578,162. Another possible solution is to replace the original substrate by a transparent substrate, such as a glass plate.

U.S. Pat. No. 5,093,879 discloses an optoelectrical connector for accommodating high density applications. This patent specification however does not disclose and does not enable to fabricate integration neither alignment of a connection for the electrical signals to the devices for emitting and/or detecting electromagnetic radiation, wherein the functioning of said devices is being controlled by said electrical signals.

U.S. Pat. No. 5,625,811 discloses an optically interconnected multichip module. The patent shows a dense integration of thin layers of semiconductor material with devices (chips) integrated therein and which are bonded to a fiber optic face plate. These chips are integrated in a multichip module and the fiber optic face plate is providing the optical intraconnection or optical transmission medium between the chips. The optical intraconnection (waveguide) is not flexible and does not allow for communication between chips which are in the same plane or in a remote location. This patent does not address the problem of a connector to an external apparatus or external devices that is versatile in use and easy to use.

The use of fiber optic face plates in combination with optoelectrical devices has further been proposed, e.g. in U.S. Pat. No. 5,074,683, and in U.S. Pat. No. 5,652,811, and in U.S. Pat. No. 5,578,162.

U.S. Pat. No. 5,631,988 discloses an optical interconnect that couples multiple optical fibers to an array of optoelectrical devices. The connector comprises a holder, a plurality of optical fibers attached to the holder, and guiding means. This connector is quite elaborate and not compaction in providing the optical path of the interconnection signals. Moreover, the direct contact of the optical fiber bundles to the optoelectrical devices can degrade such devices, in particular because the optical connection is detachable.

U.S. Pat. No. 5,367,593 provides an optical/electrical connector that includes a molded base with alignment guides and with a well for integrating an electronic circuit. Also this device is not compact and provides an optical interconnection path only for a 1-dimensional array. The teaching of this patent does not disclose nor does it suggest an optoelectrical interconnect in a dense and compact configuration which is flexible in use for a multitude of configurations such as 2-dimensional arrays of light-emitting devices on an electronic circuit.

SUMMARY OF THE INVENTION

It is an object of the present invention to disclose a socket that is easy in use for optical or optoelectronic or optoelectrical interconnection. The socket of the invention provides an interconnection device that has a dense, compact configuration. In an embodiment of the invention, the socket of the invention can be handled as a stand-alone package that allows the interconnection between electrical signals and an external apparatus for transmitting the optical signals, preferably via a high density of optical channels. The socket of the invention allows for a flexible communication between devices being controlled by electrical signals such as integrated circuits. With the socket of the invention a communication between chips in an in-plane configuration or in any other configuration or dimension is feasible. A communication between chips in an in-plane configuration (a 2-dimensional array of chips) or in any other configuration or dimension (for instance a 1-dimensional or 3-dimensional array) is feasible.

It is another object of the present invention to provide a socket for optoelectrical interconnection with a transparent substrate for high-density optical input/output applications in which the electrical input/outputs are connected to the optical input/outputs. But the electrical input/outputs are at another side of the socket, preferably opposite, to the optical input/outputs.

It is a further object of the invention to disclose a socket with features and markers for attachment and alignment of optical transfer media such as optical fibers, optical fiber bundles and optical imaging fiber bundles. The alignment features and markers allow to align the optical transfer media to the connection for electrical signals. The markers can be integrated in or can be provided on a fiber optic face plate substrate forming part of the socket. The alignment features and markers in an embodiment of the invention can comprise magnetic means for alignment and/or attachment. The optical fibers, fiber bundles or imaging fiber bundles can then further be aligned and attached to detectors integrated in a silicon integrated circuit.

Thus, here is provided a socket for optoelectrical interconnection, comprising a connection for electrical signals; an array of devices emitting and/or detecting electromagnetic radiation, the functioning of said devices being controlled by said electrical signals; and a connection to an external apparatus, the connection including a transmitter or a channel for said radiation. Said connection for electrical signals can be connected with at least a part of said devices of said array. Said connection for electrical signals can be aligned through at least one marker in or on said connection to said external apparatus with at least a part of said devices of said array. The marker can be aligned with at least part of said devices of said array. Said external apparatus can include a channel or a high density of channels for said electromagnetic radiation. The external apparatus can also include a detector and/or devices for emitting electromagnetic radiation. Said connection for electronic signals can be at a first side of said socket and said connection to said external apparatus can be at a second side of said socket.

The socket of the invention can be configured as an interconnection device for optoelectrical interconnection, comprising a connection for electrical signals; an array of devices emitting and/or detecting electromagnetic radiation, the functioning of at least a part of said devices being controlled by said electrical signals; and connection to an external apparatus including a transmitter for said radiation, said connection to said external apparatus comprising a substrate with a plurality of light channels for said radiation. The connection can be such that essentially each device of said array is aligned with at least a subset of said light channels. In an embodiment of the invention, said substrate can be a fiber optic face plate. According to this embodiment of the invention, the different parts of the interconnection device or socket are brought together adjacent one to another in a dense, compact configuration. The different parts can however be spatially separated. According to a preferred embodiment, such dense configuration can be achieved with having the different parts of the socket integrated on a substrate such as a PCB-board with a mounting technique, such as a flip-chip technique for mounting the parts, providing the alignment of the different parts one to another.

In an advantageous embodiment of the invention, the fiber optic face plate can include microlenses. The microlenses can be made according to the teaching of U.S. Pat. No. 5,871,888 or of any patent or reference cited within or with respect to this patent, U.S. Pat. No. 5,871,888 or any of the prior art teachings being incorporated herein by reference.

The socket of the invention can also be configured as an integrated socket providing the socket of the invention in a compact, single interconnection device with each of the different parts of the socket is abutting at least one of the other parts of the socket.

The socket of the invention can also have at least one marker in said connection to said external apparatus, said marker being aligned with at least part of said devices of said array.

In a preferred embodiment of the invention, in the socket essentially each of said devices for emitting and/or detecting electromagnetic radiation of said array is being confined through form and functioning and essentially each of said devices for emitting and/or detecting electromagnetic radiation of said array is being aligned with at least a part of said connection for electronic signals. With the term confined through form and functioning it is meant that without additional means or without additional structural features such as extended, large isolation features in the array of devices, each of said devices can be addressed individually via the connection for electrical signals. Such confinement through form and functioning can be done e.g. when said devices are being integrated in a single thin film semiconductor. The term confined through form and functioning is also used more generally in this specification. For instance, in an embodiment of the invention, said connection for electronic signals can include an electrically conducting glue providing separate conduction paths. These paths can be confined through form and functioning which means that without additional means the glue is providing a separate conduction path to substantially each of the devices. Also detector devices can be used that are confined through form and functioning.

In an embodiment of the invention, one can also use devices that can both emit and detect electromagnetic radiation. Examples of such devices are optical thyristors or p-n diodes.

In a preferred embodiment of the present invention, said socket includes a thin-film semiconductor layer attached to a transparent fiber optic face plate substrate, such that optoelectrical devices processed in the thin film semiconductor layer are electrically contacted from the side opposite to the side of the face-plate attachment. Markers and marker features for alignment are made in or on the fiber optic face plate. In an aspect of the invention, two sockets are abutted one against the other and information is transmitted between the light emitters/detectors of the respective sockets. An example of such use is the information transmission to and from a board with electronic devices to a rack including a multiple of such boards.

Still a further object of the invention is to disclose a system for transmitting information comprising at least one channel for electromagnetic radiation; a socket for optoelectronic interconnection, and said channel comprising a channel marker, said channel marker being aligned with a socket marker. The socket includes a connection for electronic signals; an array of devices emitting and/or detecting electromagnetic radiation, the functioning of said devices being controlled by said electronic signals, said connection being connected and aligned with at least a part of said devices of said array; a connection for said channel for said radiation; and at least one socket marker in said connection for said channel, said marker being aligned with at least part of said devices of said array. The system can further comprise an array of devices emitting and/or detecting electromagnetic radiation, said array of devices being connected to said channel, the detectors of said array being adapted for receiving said radiation and converting said radiation into electronic signals. Said detectors can further comprise detector markers such that said channel is aligned with said detector markers and such that specific parts of said array of radiation emitting devices are aligned with specific parts of said detector.

Yet another object of the invention is to disclose a method of fabricating an optoelectrical structure wherein the optical devices forming part of the structure are controlled by electrical connections that can be aligned with an external channel for transmitting the optical information. The method of fabricating the optoelectrical structure provides a way of aligning the different parts of the optoelectrical structure one with respect to the other.

In an embodiment of this object of the invention, a method of large-scale and wafer-scale fabrication of arrays of optoelectronic devices with above-mentioned transparent fiber optic face plate substrate is disclosed. A preferred embodiment of the invention reveals wafer scale fabrication of the optoelectronic devices on a fiber optic face plate including integrated socket features.

Yet any combination can be made of any of the embodiments of the devices or methods of the invention, disclosed in the present patent application.

BRIEF DESCRIPTION OF THE DRAWINGS

Exemplary embodiments of the invention and of the use of the invention are shown in the drawings. The drawings are schematic representations of the invention and therefore the dimensions and the relative dimensions do not correspond to actual reductions to practice of the invention.

FIGS. 5a and 5b illustrate the use of the socket of FIG. 2. as an optical connection window for optical channels in an hermetically sealed packaged chip.

FIG. 6 shows a wafer-scale fabrication process to manufacture the sockets according to the present invention.

FIG. 7 shows another wafer-scale fabrication process to manufacture the sockets according to the present invention.

DETAILED DESCRIPTION OF SEVERAL EMBODIMENTS OF THE PRESENT INVENTION

The invention is described in the sequel through a detailed description of several embodiments of the invention. It is obvious that other embodiments of the invention can be configured according to the knowledge of persons skilled in the art without departing form the true sprit of the invention, the invention being limited only by the terms of the appended claims.

Figure 1:
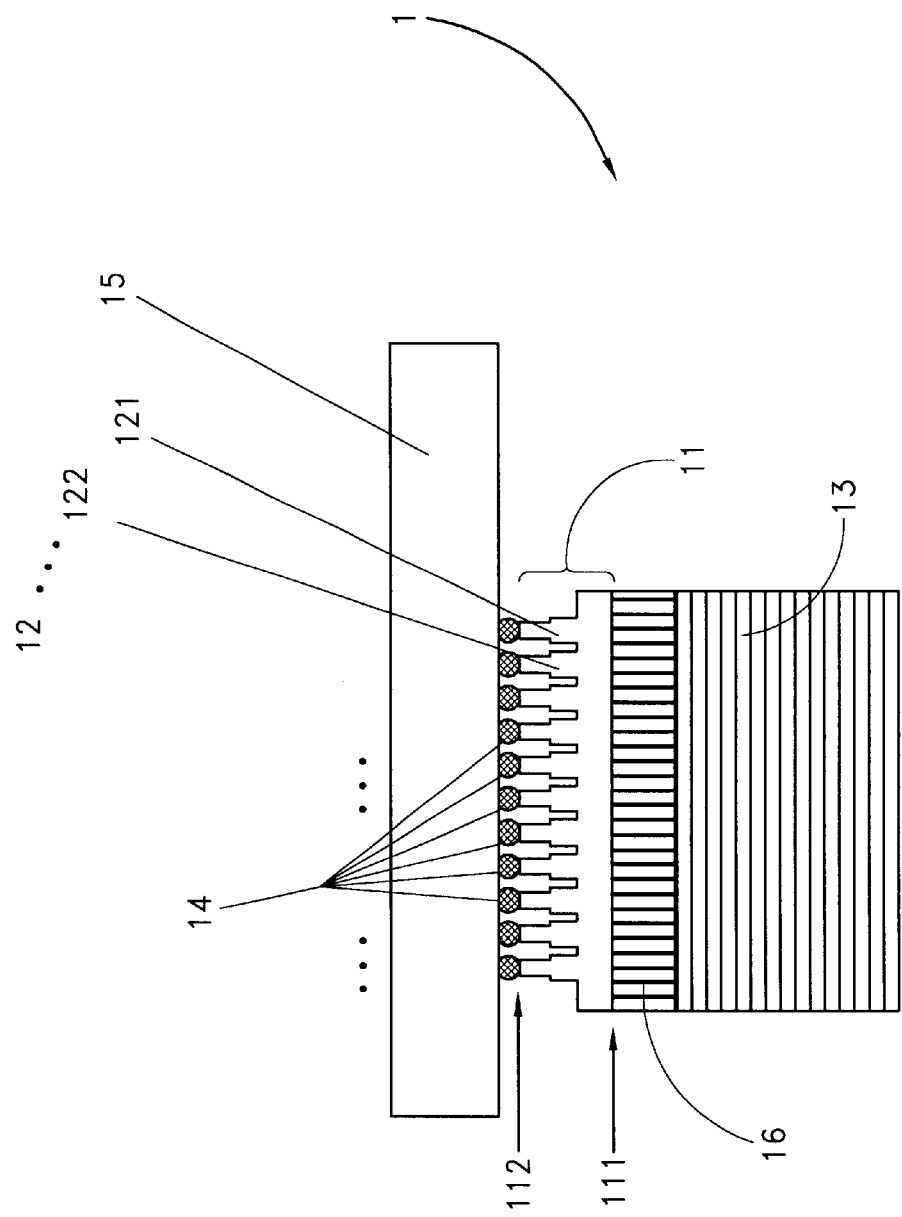
FIG. 1 depicts a socket according to an embodiment of the present invention. The socket comprises a thin semiconductor film with optoelectrical devices therein and a fiber optic face plate for optical connection. Said socket is attached to a carrier for electrical connection, at a side opposite to said fiber optic face plate.

FIG. 1 depicts a socket 1 according to one embodiment of the present invention. One surface 111 of a thin-film semiconductor 11 is attached to a fiber optic face plate 13. Optoelectrical or optoelectronic devices 121, 122, etc., generally referred to as 12, are fabricated in the thin-film semiconductor 11. Means for electrically conductive bonding 14 are provided at the other surface 112 of the thin-film semiconductor, and perform the double function of mechanically attaching the thin-film semiconductor to a carrier 15, and providing electrical connection between said carrier and said optoelectronic devices.

The carrier 15 can be an integrated circuit. It can, however, also be a multichip module, a board such as a printed circuit board, a part of a connector, or, in general, any carrier that provides electrical signals and/or electrical power to the optoelectronic devices 12.

Examples of possible means for electrically conductive bonding 14 are metal bumps, solder balls, conductive epoxy, conductive polymers and equivalents. Said means include a combination of a means for electrical feed-through, such as metal bumps, with a means for mechanical attachment, such as underfill, glue, resist, epoxy, or equivalent products.

Based on the knowledge of person skilled in the art, a glue can be chosen that is an electrically conducting glue which allows for separate conduction paths through form and functioning.

The fiber optic face plate 13 transmits optical inputs and outputs of the optoelectronic devices 12. The attachment 16 of thin-film semiconductor 11 to fiber optic face plate 13 has to be transparent for the light of the optoelectronic devices. Attachment 16 is preferably done by means of an epoxy, including EPO-TEK 353ND of Epoxy Technology Inc, or a polyimide, including PIQ-13 of Hitachi chemical, that withstand high temperatures (several hundreds degrees Celsius). However, the invention also covers the use of other means of attachments, such as soldering glass or direct bonding of the thin-film semiconductor 11 to the fiber optic face plate 13.

Figure 2A:
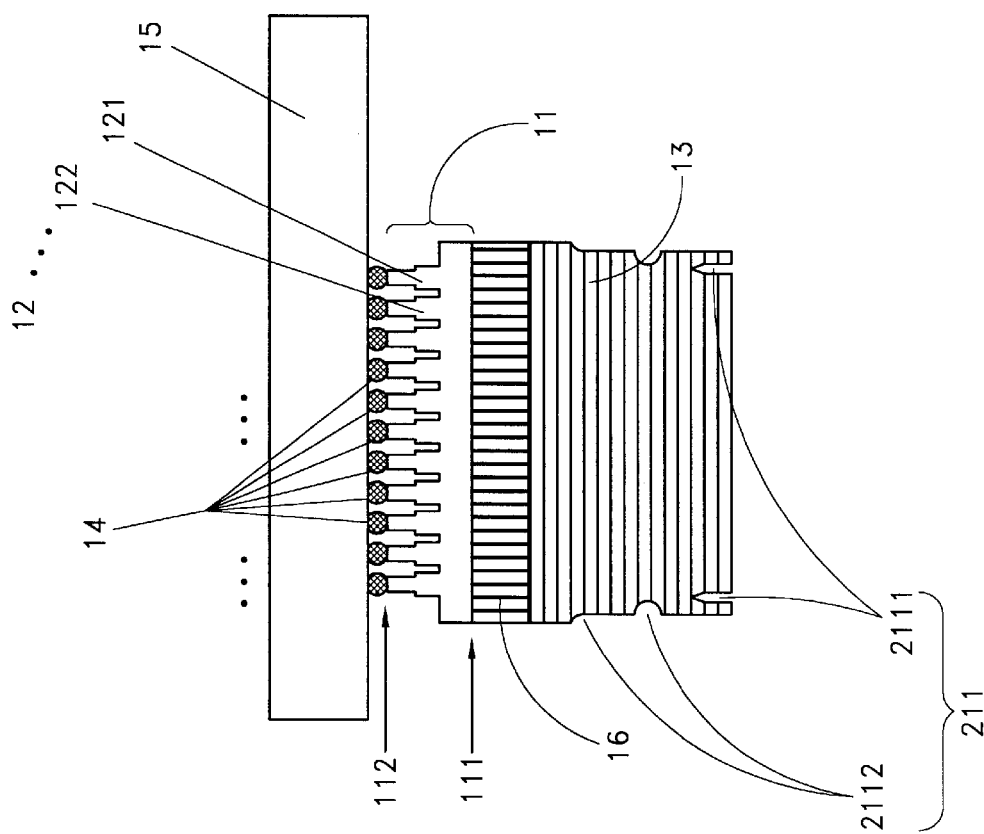
FIG. 2a depicts a socket according to a preferred embodiment of the present invention. The socket comprises a thin semiconductor film with electronic devices therein and a fiber optic face plate containing markers. Said socket is attached to a carrier at a side opposite to said fiber optic face plate.
Figure 2B:
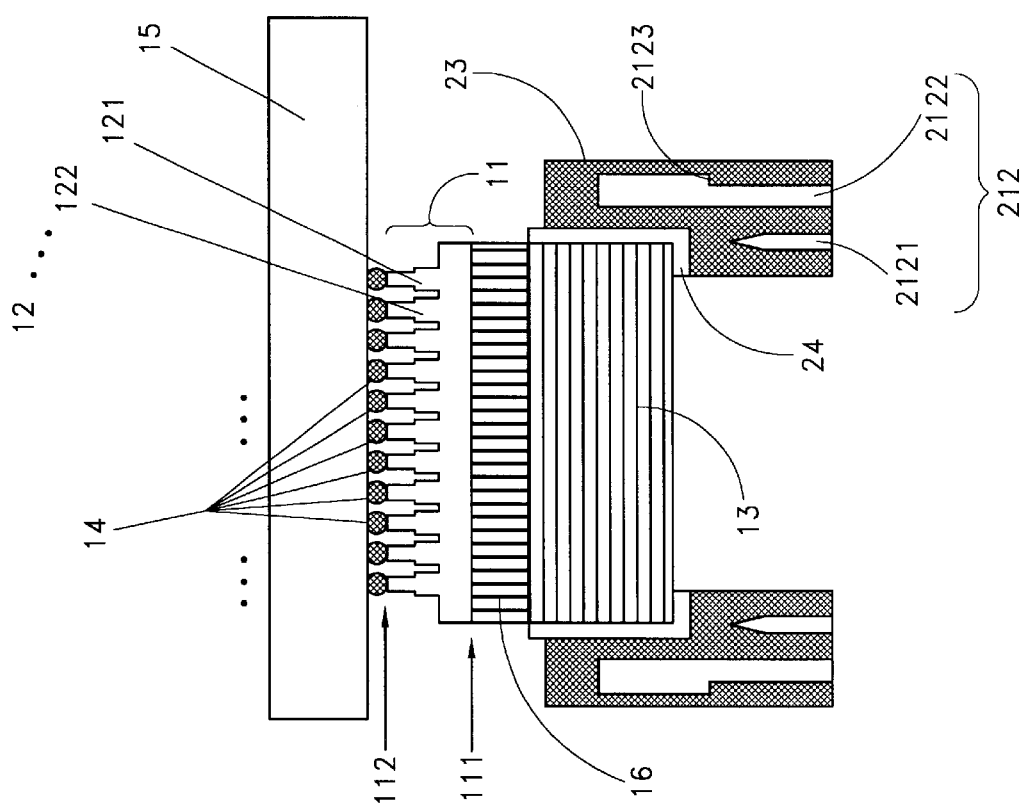
FIG. 2b depicts a socket according to another preferred embodiment of the present invention. The socket comprises a thin semiconductor film with electronic devices therein and a fiber optic face plate. A piece for attachment and alignment containing markers is glued on the face plate. Said socket is attached to a carrier at a side opposite to said fiber optic face plate.
Figure 2C:
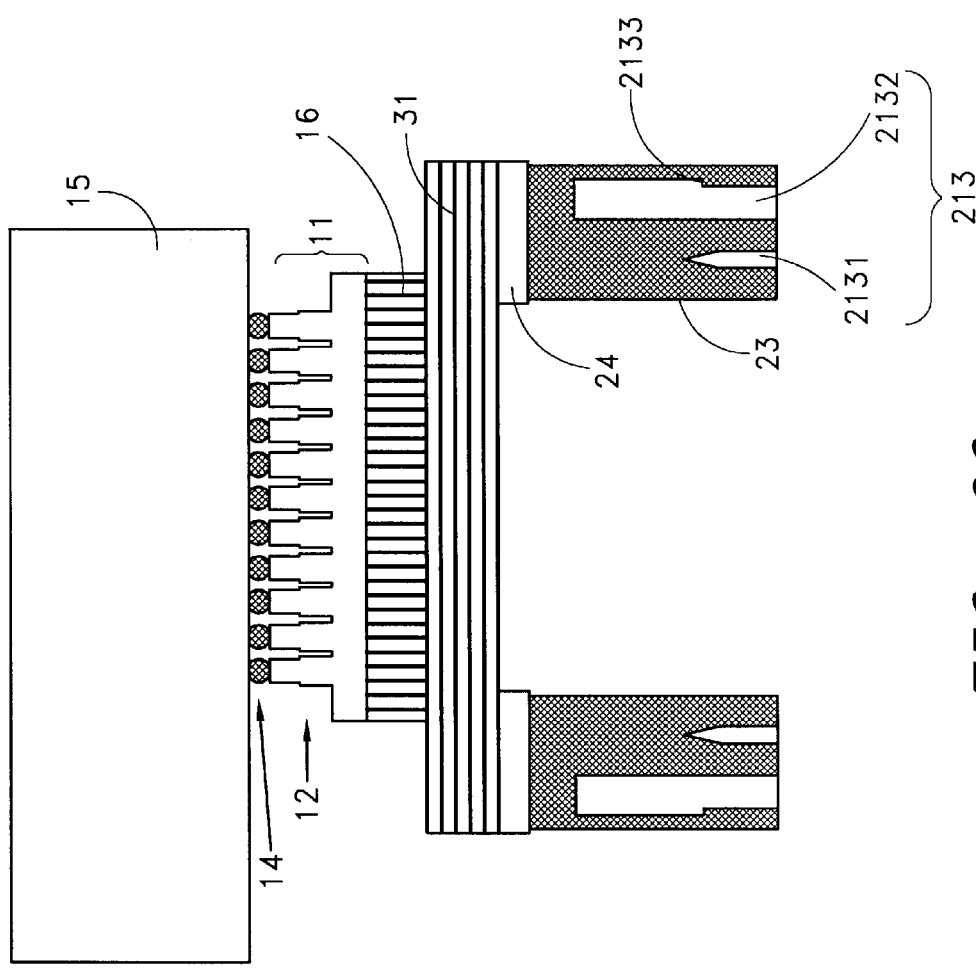
FIG. 2c depicts a socket according to an alternate embodiment of the present invention. The socket comprises a thin semiconductor film with electronic devices therein and a fiber optic face plate. A piece for attachment and alignment containing markers is connected to the face plate. Said socket is attached to a carrier at a side opposite to said fiber optic face plate.

According to a preferred embodiment of the invention, depicted in the FIG. 2a, fiber optic face plate 13 has markers 211 including grooves and holes. The markers 2111, 2112 can also be fabricated upon the fiber optic face plate instead of in the fiber optic face plate as shown on the drawings 2b and 2c. The FIGS. 2b and 2c show a piece 23 for attachment and alignment containing markers. The piece 23 can be attached, for instance with a glue 24, on the face plate 13 while in alignment to the structures 112 that are already processed. Shown in the FIGS. 2b and 2c are the piece (23) for attachment and alignment containing at least one marker (2121, 2131) for alignment and at least one cavity (2122, 2132) for attachment including at least one structure (2123, 2133) for clamping the feature of the external apparatus meant for fixing the external apparatus.

Thus the markers generally labelled as 21 include markers 2111, 2121, 2131 for aligning and features 2112, 2122, 2132 for attaching an external apparatus through a plug. The markers can also be receptacles for pins. With markers 21 in or on fiber optic face plate 13, the structure can be used as a socket. The socket can comprise a thin semiconductor film with optoelectronic devices therein and is attached to a carrier at one side and to a fiber optic face plate at another side. An advantage of providing markers 21 preformed in or on face plate 13 is that alignment of the optoelectronic devices 12 to said features can be obtained during the fabrication of the socket. This will be further clarified below.

Figure 2D:
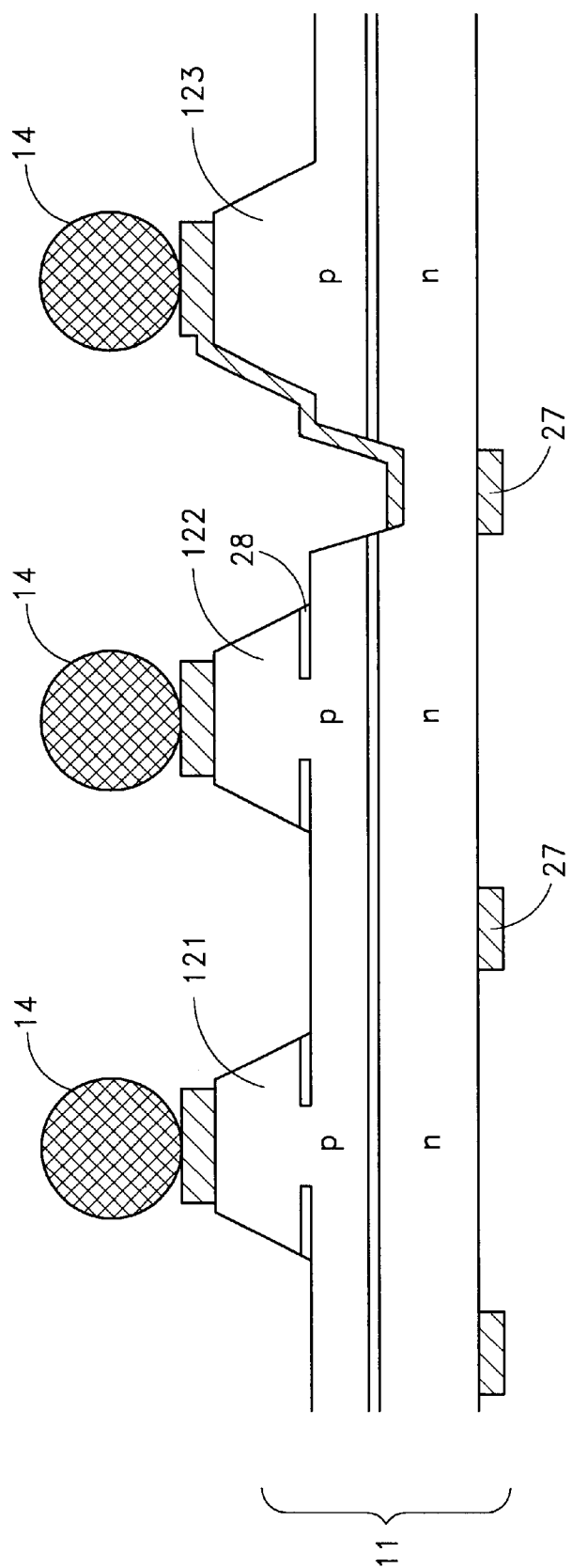
FIG. 2d shows in detail the thin semiconductor film with the optoelectronic devices therein being confined through form and functioning and with the electrodes contacting the devices.

In the preferred embodiments of the invention (FIGS. 2a, 2b, 2c), the optoelectronic devices for emitting radiation are confined through form and functioning. Each of said devices is aligned with at least a part of said connection for electrical signals. The confinement through form and functioning is shown in detail in FIG. 2d where the confinement is realized through mesa etch confinement and current confinement by a limited lateral oxidation 28. The technique of mesa etching is known to the person skilled in the art. Ways of realizing the confinement can be current confinement, proton confinement or oxide confinement. In essence, an extended space charge layer is to be defined in order to isolate the devices one from another and to realize in this way the confinement through form and functioning of the device. Each of the devices can be addressed individually through the metal grid structure 27 on one side of the thin semiconductor layer and the solder balls 14 on the other side of the semiconductor layer. In general, every optoelectronic device 12 has two electrodes. Arrays of optoelectronic devices can be operated with one electrode common to all devices of the array, or with separate electrodes for each device of the array.

Figure 3A:
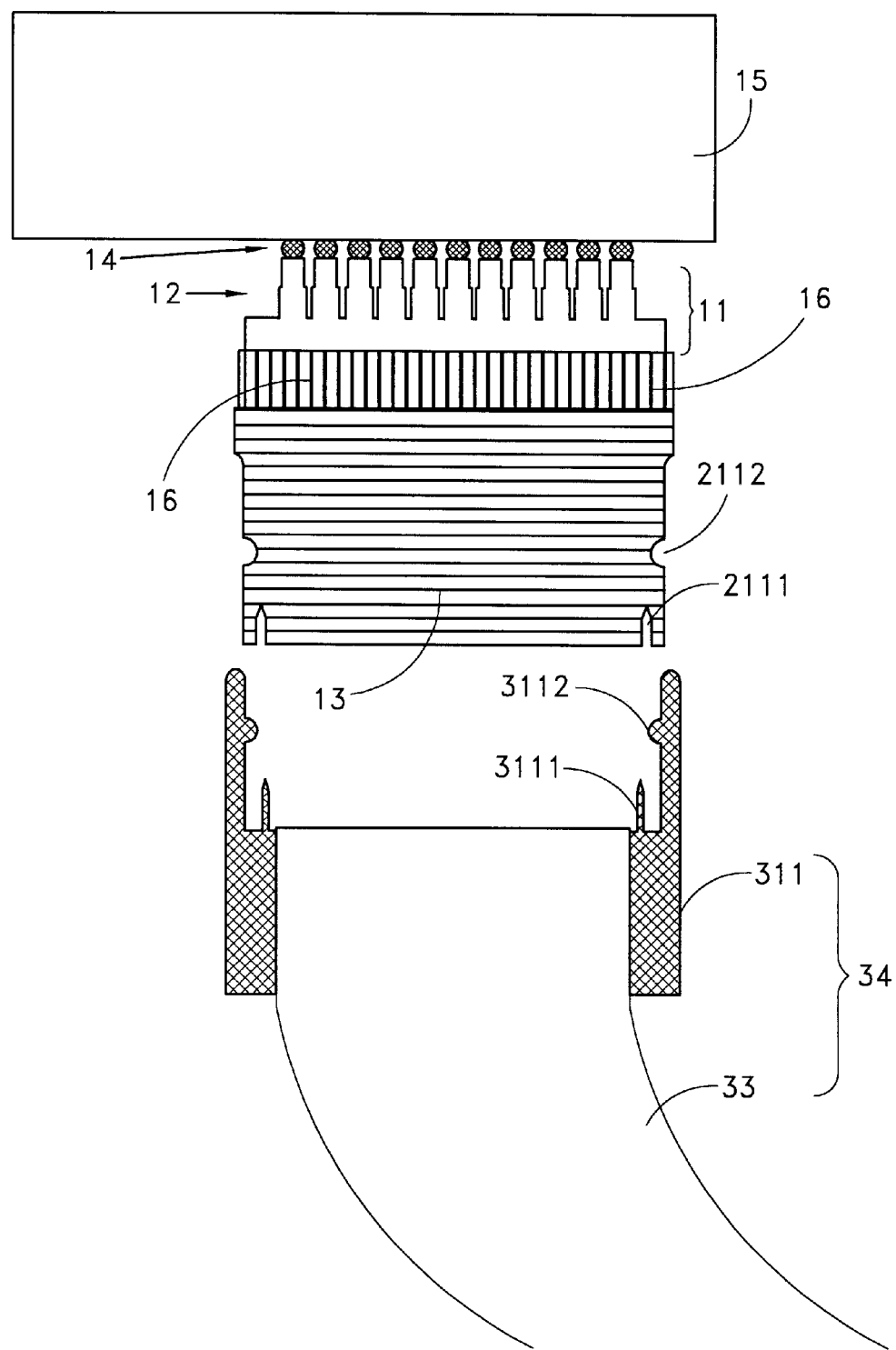
FIGS. 3a, 3b depict the use of a socket of FIG. 2a and FIG. 2b respectively wherein a plug is attached as an external apparatus to the socket. Said plug can hold a light-guiding device such as an imaging fiber bundle or a bundle of fibers.
Figure 3B:
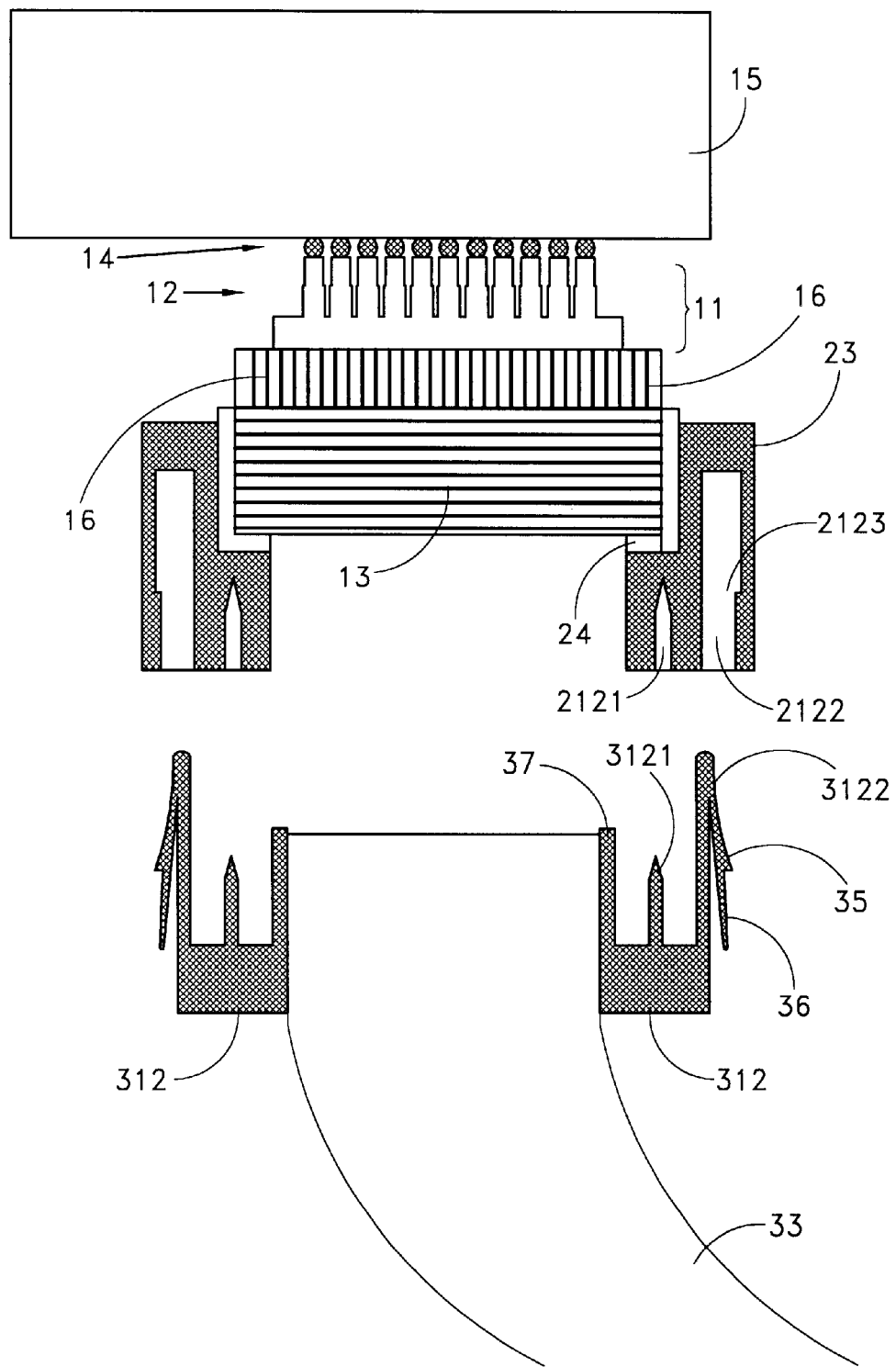

FIGS. 3a and 3b depict the use of a plug 311, 312 connected to a socket. Plugs 311, 312 have means for alignment 3111, 3121 and means for attachment 3112, 3122. In an embodiment of the invention shown in FIG. 3a, the plug 311 can have means for alignment 3111 and means for attachment 3112 that mate to markers 211 and 212 of a socket according to the invention, respectively. Plug 311 can be the termination 311 of a light-guiding device 33, that could, for example, be an imaging fiber bundle or a bundle of optical fibers. The plug-terminated light-guide will henceforth be referred to as structure 34. By plugging structure 34 into the socket, the optical inputs and outputs of the optoelectronic devices 12 can be transported to a remote location. Moreover, because optoelectronic devices 12 can be aligned to the markers 2111 of the socket during fabrication, and because markers 2111 mate to markers 3111 of plug 311, plug 311 automatically aligns to the optoelectronic devices 12 when it is snapped into the socket.

FIG. 3b shows the alignment and the attachment of a plug 312 to the socket of FIG. 2b. More particularly is shown a fiber bundle 33 terminated by a plug 312. Plug 312 includes a part that slides into the cavity 2122 and, when pushed, the structure 35 will snap behind the structure 2123 such that the plug 312 cannot slide out of the structure 23 any more. To release it, the spring 36 has to be pressed and simultaneously the fiber 33 has to be pulled out. The alignment is automatically arranged by the marker 3121 that is guided in the alignment cavity 2121. A minimum distance of the fiber end to the face plate 13 can be set by the stud 37.

Figure 4:
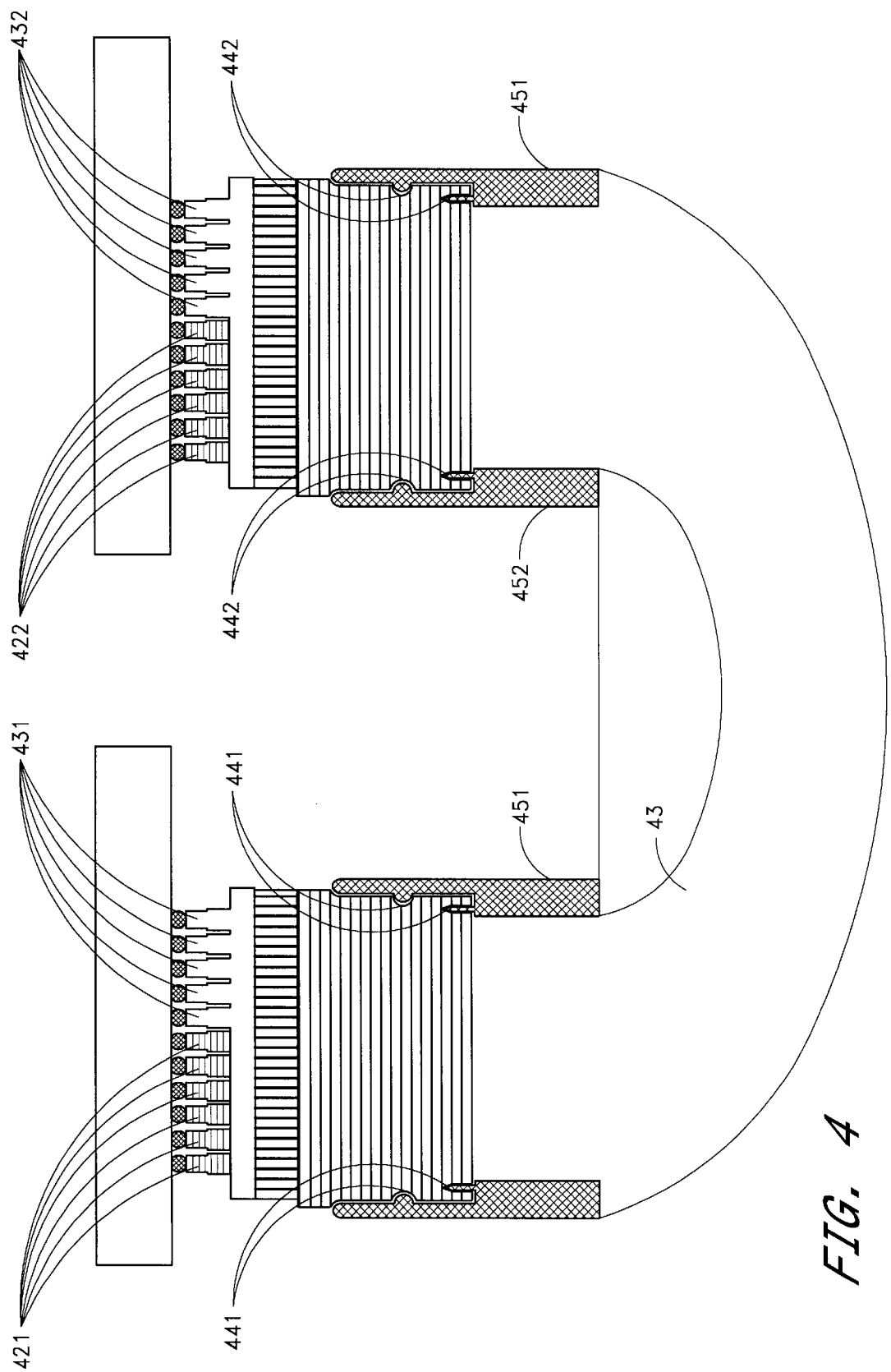
FIG. 4 illustrates a system for transmitting electronic information over an optical link. The system is configured as an optical interconnect using two socket structures.

Further, FIG. 4 illustrates the use and advantages of this alignment. According to this aspect of the invention, the plug can be used as holder for an array of optoelectronic devices that match with another array of optoelectronic devices. For example, in case the optoelectronic devices of one array are light-emitting devices, the plug can contain an array of detectors that are essentially aligned to the emitters when the plug is snapped into the socket.

An application in a system for transmitting electrical information and for providing an optical interconnect between two chips is disclosed. The system is a basic building structure for parallel optical interconnects between chips. Imaging fiber bundles, well know from medical imaging, and used among others in endoscopes, transport an image from one place to another with a one to one correlation between light input and light output image.

In detail, in FIG. 4 are shown a first socket structure containing emitters 421 and detectors 431, aligned to markers 441 of a first fiber optic face plate, and a second socket structure, containing emitters 422 and detectors 432, aligned to markers 442 of a second fiber optic face plate. The arrays of light emitting devices are spaced very densely, in arrays on a pitch of 100 micron or even less. A light-guide 43 is also shown having both its ends terminated with a plug. A first plug fits into the first socket and aligns to the markers of said first socket. The second plug fits into the second socket and aligns to the markers of said second socket. Both ends of the plug-terminated light-guide 43 are to be snapped into their respective sockets. All light detectors 432 face corresponding emitters 421, and all light detectors 431 face corresponding emitters 422, by simple mechanical alignment. This is due to the cascade of alignments of the devices 421 and 431 to markers 441, markers 441 to plug 451, plug 451 to light-guide 43, light-guide 43 to plug 452, plug 452 to markers 442, and of markers 442 to devices 422 and 432.

An example of the use of the socket of the invention is shown in FIG. 5. In this example, the carrier 15 is an integrated circuit die 51. Integrated circuit die 51 is attached to a package base 53. Electrical wires 52 connect electrical input and output pads of the integrated circuit die to pins 54 of the package. Now, according to the present invention, the socket of FIG. 2 can be used for providing optical inputs and outputs to the integrated circuit. As shown in FIG. 5, more than one socket can be provided on the same integrated circuit die 51. The optoelectronic devices 12 integrated on sockets can include light-emitters, such as Vertical-cavity Surface Emitting Lasers (VCSELs) or Light-Emitting Diodes (LEDs). They also can include detectors such as p-i-n diodes. Alternatively, the detectors can be integrated in the integrated circuit die 51 rather than in the thin-film semiconductor 11.

As shown in FIG. 5, an integrated circuit die 51 mounted on and bonded to package base 53 can be further capped, for example with plastic moulding 55, leaving sockets accessible for attachment of light-guides. In this way, the electrically and optically interconnected integrated circuit 51 is completely protected from the environment, while still accepting optical inputs and outputs. Therefore, the described method results in the fabrication of a practical electrically and optically interconnected integrated circuit 51. Electrically and optically interconnected integrated circuit 51 can safely be shipped, mounted onto a board, and undergo other handling operations. It is more robust and practical to use and to mount than a pig-tailed chip—this is a chip which has light-guides attached to it—and than a partially-uncovered chip—in which a part of the integrated circuit which is intended to offer optical accessibility is naked and unprotected from the environment.

As mentioned previously, the optoelectronic devices 12 can be aligned to circuitry of the integrated circuit die 51 during the application of the electrically conductive bonding 14. For example, if the electrically conductive bonding consists of solder balls, optoelectronic devices 12 are aligned during the flip-chip bonding process. Furthermore, as stated above, the optoelectronic devices can be aligned to the markers 21 of the fiber optic face plate 13 during the fabrication of the socket of the invention. Hence, when a plug exemplified by 311, 312 is attached to a socket of the invention, it is automatically aligned to both the optoelectronic devices 12 of said socket and to the underlying circuitry in integrated circuit die 51. Therefore, a connection such as depicted in FIG. 4 can be organized between several sockets of the invention on an electrically and optically interconnected integrated circuit 51, creating intra-chip optical interconnects. Also, such connection can be established between sockets of the invention on different electrically and optically interconnected integrated circuits 51, creating inter-chip optical interconnects between said chips.

By using a socket structure of the invention on an integrated circuit die 51 to create electrically and optically interconnected integrated circuit 51, the total area of optoelectronic semiconductor material consumed is small as compared to the area of the silicon integrated circuit. This is favorable, because the price of optoelectronic semiconductor material per unit area is normally much larger than the price of silicon integrated circuits per unit area. Therefore, the proposed method for fabricating an electrically and optically interconnected integrated circuit 51 is economically more competitive than methods including bonding of an optoelectronic semiconductor wafer to a silicon wafer.

According to another aspect of the invention, the use of a socket structure including a fiber optic face plate for providing optical connection to an integrated circuit is extended to the case where the optoelectronic devices are integrated in the integrated circuit rather than on a thin-film semiconductor. A fiber optic face plate with features is aligned to circuitry including optoelectronic devices in a carrier, which, in a preferred embodiment, is an integrated circuit die. The attachment means of the fiber optic face plate to carrier is transparent, and includes the use epoxy, cyanoacrilate glue and polyimide. In a preferred embodiment, said optoelectronic devices include detectors integrated in silicon circuitry.

A preferred method for fabricating structures according to the present invention is disclosed in FIG. 6A to FIG. 6F. Shown in FIG. 6A are epitaxial layers (surface layers) 611, 612 grown on a substrate 62, which can be a semiconductor, typically selected from group IV, group III-V or group II-VI, or a dielectric material, such as sapphire. The epitaxial layers include layers 612 for selectively stopping a chemical etch and layers 611, that include a junction between two semiconductor materials of opposite doping type. Henceforth, the combination of epitaxial layers 611, 612 with substrate 62 is called the semiconductor structure 63. After the growth, partial processing of semiconductor devices can be started, as shown in FIG. 6B. This partial processing is henceforth called "rear side Processing" 641, because it will ultimately be located at the rear side of the optoelectronic devices. Rear side processing 641 can typically be the deposition of a metal grid 6411 on top of the epitaxial layers 611, 612. It can also consist of a roughening 6412 of the surface of the epitaxial layers, using a process such as lithography. Shown in FIG. 6C, the semiconductor structure 63 is then flipped over, and epitaxial layers 611 are attached to a fiber optic face plate 13. Said face plate can have preformed markers 211. Preferred means 16 for attachment of the epitaxial layers 611 to the fiber optic face plate 13 is a transparent, low-shrinkage, temperature resistant epoxy or polyimide. If rear side processing 641 is used to process structures in the epitaxial layers 611, and if the fiber optic face plate 13 contains markers 211, then alignment of said processed structures to said markers 211 is necessary during the attachment of the epitaxial layers 61 to the fiber optic face plate 13. The next step, illustrated in FIG. 6D, is the removal of substrate 62. Mechanical grinding and polishing, as well as chemical etching can be used to this end. This removal process stops in one of the epitaxial layers 612, such that at least layers 611 remain intact. An example of an adequate substrate removal technique is given in U.S. Pat. No. 5,578, 162. After this substrate removal, processing of optoelectronic devices 12 is continued, as shown in FIG. 6E. It is called "front side" processing 642. If fiber optic face plate 13 contains markers 211, then the front side processing requires alignment to the markers 211. This is straightforward to achieve with reasonable precision, because markers 211 are imaged by the fiber optic face plate to the interface between fiber optic face plate 13 and epitaxial layers 611, and are visible there through the thin-film semiconductor. After front side processing of optoelectronic devices, means for electrically conductive bonding 14 are provided to contact the optoelectronic devices 12, as shown in FIG. 6F. A preferred means for electrically conductive bonding are solder balls. The structure generally depicted in FIG. 6F will further be referred to as structure 68.

The fabrication method disclosed so far can be applied to wafer level. This is advantageous for mass production and low-cost manufacturing. The above-disclosed fabrication technique allows optoelectronic devices 12 to be aligned both to the backside processing 641 and to markers 211 preformed in the fiber optic face plate 13 over the complete wafer. This alignment can be achieved using conventional alignment tools and techniques. The alignment of the different parts of the socket of the invention in fact is provided by way of the fabrication method.

Fabrication of a structure according to the invention is terminated by separating an individual die 69 from structure 68, as shown in FIG. 6G, and bonding it to a carrier 15. In case the means for electrically conductive bonding 14 are solder balls, the bonding technique is flip-chip joining, eventually followed by filling of the space between carrier 15 and epitaxial layers 611 using, for example, an underfill, glue, epoxy, resist, or equivalent.

In an alternative fabrication method of the structure according to the present invention, the means for electrically conductive bonding 14 is applied to a carrier 15 rather than to structure 68. The process sequence as described above can also be applied for a face plate which does not contain markers. This is shown in FIGS. 7A–7F. FIG. 7G shows a piece 72 including markers can be attached to the face plate using for instance glue 24. This can occur on wafer level before cleavage of the individual sockets 78. In an alternative process sequence, the markers can be attached after cleavage of the sockets 78. For both alternatives the markers can be aligned to the optoelectronic devices.

Figure 8A:
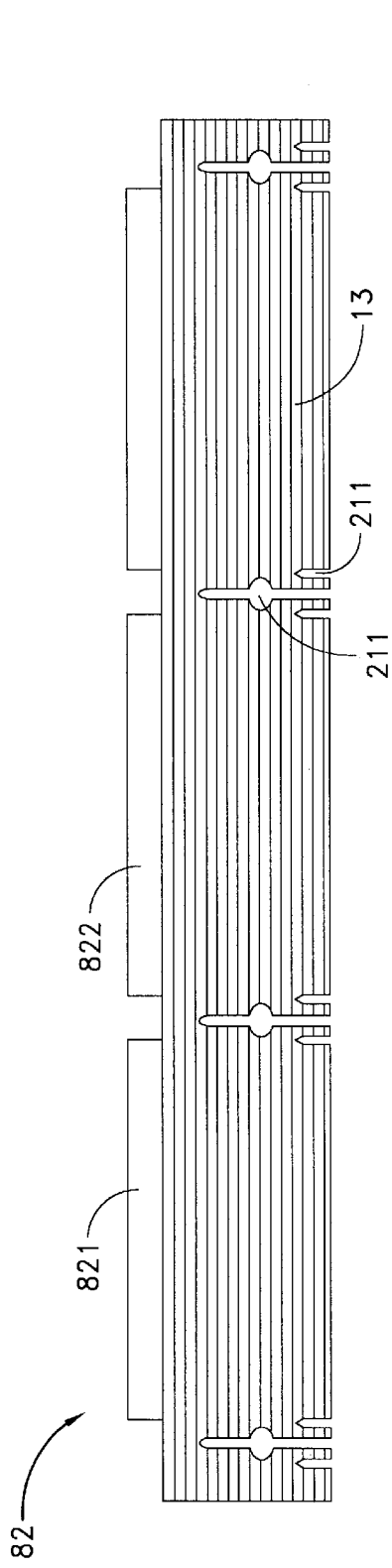
FIG. 8 shows an alternative wafer-scale fabrication process including a step of epitaxial lift-off.
Figure 8B:
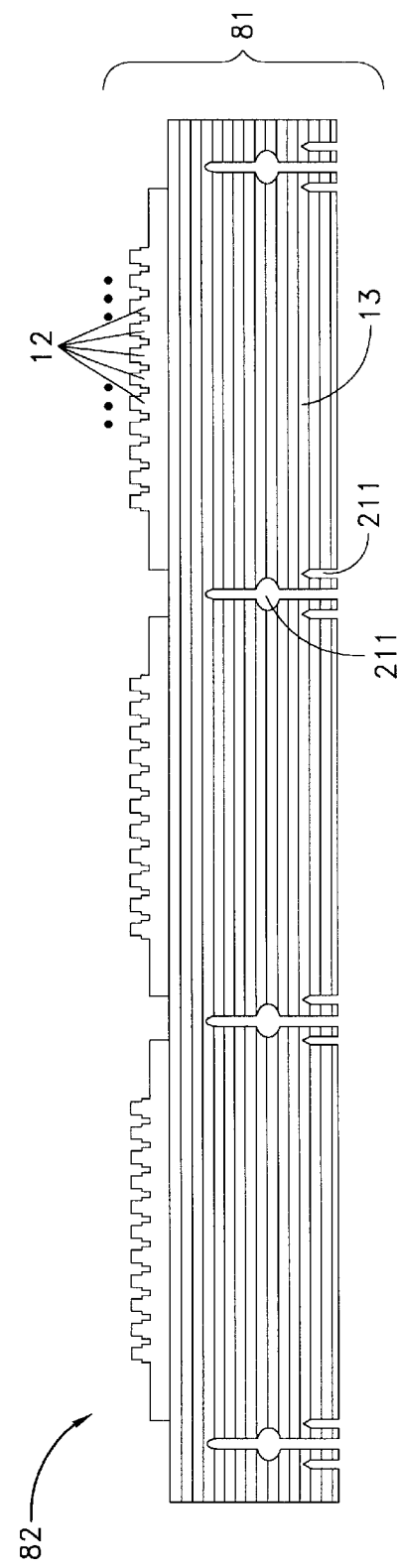

Another method for fabricating the structure according to the invention, is described in FIG. 8. The thin-film semiconductor containing epitaxial layers that include a p-n junction are separated from the original substrate by epitaxial lift-off. Devices can be processed before or after transfer of said thin-film semiconductor to the fiber optic face plate. In the preferred embodiment, the processing is done after film transfer. FIG. 8A depicts transferred epitaxial films 82, containing a p-n junction, attached to a fiber optic face plate 13. As shown in FIG. 8A, several epitaxial films 821, 822, . . . can be juxtaposed. This is useful, because it is notoriously difficult to lift-off an epitaxial film having the size of a wafer, and therefore it is desired to lift-off smaller pieces. The processing of the optoelectronic devices can proceed analogously as in the case explained in FIG. 6E to FIG. 6F. The structure obtained after processing is shown in FIG. 8B, and is referred to as structure 81. An alignment of optoelectronic devices 12 to markers 211 in the fiber optic face plate 13 is obtained during device processing, analogously as in the previously-described method. The application of the means for electrically conductive bonding is also analogous the said application in the above-described processing method.

Figure 9A:
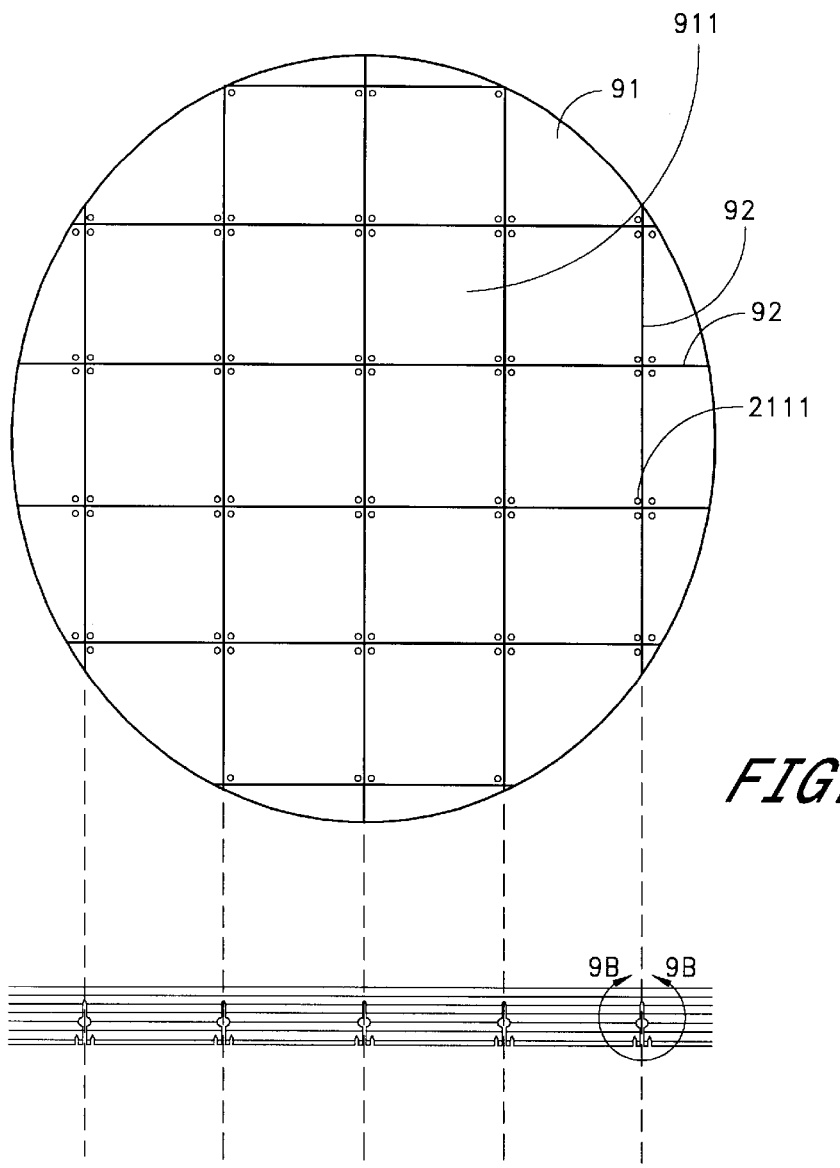
FIG. 9 illustrates an embodiment of the processing of a fiber optic face plate for use in the fabrication of the present invention.
Figure 9B:
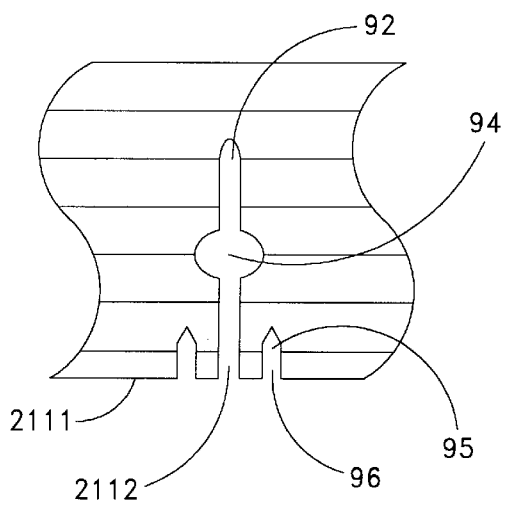

In FIG. 9 is shown an embodiment of the processing of the fiber optic face plate to create the markers for use in the fabrication methods of FIG. 6. FIG. 9A shows the top side of the face plate, perpendicular to the fibers in the plate. FIG. 9B shows the cross-section, with the fibers running vertically. The grooves 92 are sawn into the fiber optic face plate 91, for instance in a square pattern. The bottom of the groves has a shape suited for controlled cleaving of the fiber optic face plate after completion of the processing, as shown in FIG. 6G. Grooves 92 extend from one side to the other of the fiber optic face plate. Laser machining or milling can be used to create a notch 94 at both sides of the groves 92. Together with the groove 92, this notch will turn into the receptacle 2112 for the plug feature 3112 after cleavage of one chip, exemplified as 69, from fiber optic face plate 91. Features 2111, that guide alignment pins 311 of plug 311, can be made in the surface of the fiber optic face plate by precision drilling or laser machining. Features 2111 can consist of a circular hole 95 with a tapered end 96 for easy insertion of the alignment pins 3111.

What is claimed is:

1. An interconnection device for optoelectrical interconnection, comprising:
   a connection for electrical signals;
   an array of devices emitting and/or detecting electromagnetic radiation, the functioning of at least a part of said devices being controlled by said electrical signals;
   a connection to an external apparatus, the connection including a transmitter for said radiation, said transmitter comprising a substrate with a plurality of light channels for said radiation; and
   wherein said substrate is a fiber optic face plate.

2. An interconnection device for optoelectrical interconnection, comprising:
   a connection for electrical signals;
   an array of devices emitting and/or detecting electromagnetic radiation, the functioning of at least a part of said devices being controlled by said electrical signals;
   a connection to an external apparatus, the connection including a transmitter for said radiation, said transmitter comprising a substrate with a plurality of light channels for said radiation; and
   having at least one marker in said connection to said external apparatus, said marker being aligned with at least part of said devices of said array.

3. A system for transmitting information comprising a channel for electromagnetic radiation and a socket for optoelectrical interconnection, said socket including:
   a connection for electrical signals;
   an array of devices emitting and/or detecting electromagnetic radiation, the functioning of said devices being controlled by said electrical signals, said connection for electrical signals being connected and aligned with at least a part of said devices of said array;
   a connection to said channel for said radiation and at least one socket marker in or on said connection to said channel, said marker being aligned with at least part of said devices of said array, said connection to said channel comprising a substrate with a plurality of light channels for said radiation and said channel comprising a channel marker, said channel marker being aligned with said socket marker.

4. The system as recited in claim 3 further comprising an array of devices emitting and/or detecting electromagnetic radiation, said array of devices being connected to said channel, the detectors of said array being adapted for receiving said radiation and converting said radiation into electrical signals.

5. The system as recited in claim 3 wherein said detectors of said array comprise detector markers such that said channel is aligned with said detector markers and such that specific parts of the array of radiation emitting devices are aligned with specific parts of the array of detector devices.

6. An interconnection device for optoelectrical interconnection, comprising:
   a connection for electrical signals;
   an array of devices emitting and/or detecting electromagnetic radiation, the functioning of at least a part of said devices being controlled by said electrical signals;
   a connection to an external apparatus, the connection including a transmitter for said radiation, said transmitter comprising a substrate with a plurality of light channels for said radiation; and
   wherein said connection for electrical signals, said array of devices and said connection to said external apparatus are integrated in an integrated socket, and wherein each of said connection for electrical signals, said array of devices and said connection to said external apparatus are abutting at least to one other of said connection for electrical signals, said array of devices and said connection to said external apparatus.

7. The socket as recited in claim 6 wherein essentially each device of said array of devices can be addressed individually via said connection for electrical signals.

8. The socket as recited in claim 6 wherein said connection for electrical signals is connected and aligned with at least a part of said devices of said array.

9. The socket as recited in claim 6 wherein said external apparatus comprises of at least one channel for said electromagnetic radiation.

10. The socket as recited in claim 6 wherein said external apparatus includes at least one detector and/or devices for emitting electromagnetic radiation.

11. The socket as recited in claim 6 having at least one marker in said connection to said external apparatus, said marker being aligned with at least part of said devices of said array.

12. The socket as recited in claim 6 wherein said connection for electrical signals is being directly connected with at least a part of said devices of said array.

13. The socket as recited in claim 6 wherein said connection for electrical signals is at a first side of said socket and said connection to said external apparatus is at a second side of said socket.

14. The socket as recited in claim 6 wherein essentially each of said devices emitting and/or detecting electromagnetic radiation is being confined through form and functioning and wherein essentially each of said devices of said array is being aligned with at least a part of said connection for electrical signals.

15. The socket as recited in claim 6 wherein said marker is at least one groove in said fiber optic face plate.

16. The socket as recited in claim 6 wherein said marker is deposited upon said fiber optic face plate.

17. The socket as recited in claim 6 further comprising a radiation transparent attachment for attaching said fiber optic face plate to said array of devices.

18. The socket as recited in claim 6 wherein said array of devices is integrated in a single first substrate.

19. The socket as recited in claim 6 wherein said connection for electrical signals comprises a plurality of connection paths and wherein each of said paths is being connected to a specific subset of said devices of said array.

20. The socket as recited in claim 6 wherein said connection for electrical signals comprises a plurality of connection paths and wherein each of said devices emitting and/or detecting electromagnetic radiation is being connected to a specific subset of said paths.

21. A plurality of sockets as recited in claim 6, said plurality of sockets being mounted on one common surface of a carrier.

22. The plurality of sockets as recited in claim 21 being at least partly encapsulated.

23. The socket as recited in claim 6 wherein said devices are light emitting devices being integrated in a single thin film semiconductor, essentially each of said devices of said array being confined through form and functioning.

24. The socket as recited in claim 23 wherein said connection for electrical signals includes electrically conducting solder balls.

25. The socket as recited in claim 23 wherein said connection for electrical signals includes an electrically conducting adhesive.

26. The socket as recited in claim 25 wherein said adhesive is a glue providing separate conduction paths.

27. The socket as recited in claim 25 wherein said adhesives a glue providing conduction paths that are separate through form and functioning.

28. The socket as recited in claim 6 wherein said devices are detectors being integrated in a semiconductor substrate, said substrate comprising said connection for electrical signals.

29. The socket as recited in claim 6 wherein said external apparatus is attached, preferably in a removable way, by mechanical or electromagnetic means or by a combination thereof to said connection to said external apparatus.

30. A method of fabricating an optoelectrical apparatus comprising the steps of:
providing an array of devices for emitting and/or detecting electromagnetic radiation in a first substrate on a first side of said substrate;
attaching said first substrate to a second substrate, said first side being on said second substrate and being transparent for said radiation;
providing markers in or on said second substrate thereby ensuring that said markers are aligned with the devices of said array;
providing electrical connections to said array of devices.

31. The method as recited in claim 30 wherein while providing electrical connections to said array of devices, it is ensured that essentially each of said devices are addressed individually.

32. The method as recited in claim 30 further comprising the step of:
growing at least one surface layer on said first substrate and thereafter executing the step of providing said devices in said surface layer.

33. The method as recited in claim 32 further comprising the step of:
thinning said first substrate, and isolating through form and functioning the individual devices of said array.

34. The method as recited in claim 33 wherein said isolating step includes a mesa etch for isolating the individual devices.

35. The method as recited in claim 34 wherein said markers in or on said second substrate are provided with a substantially corresponding image thereof as used for defining the array of devices.

36. The method as recited in claim 35 wherein said second substrate is transparent for said radiation.

37. The method as recited in claim 35 further comprising the step of:
thinning said first substrate, and isolating through form and functioning the individual devices of said array.

38. The method as recited in claim 35 wherein said markers in or on said second substrate are provided with a substantially corresponding image thereof as used for defining the array of devices.

39. A method of fabricating an optoelectrical device comprising the steps of:
growing a surface layer on a first substrate;
providing an array of devices for emitting and/or detecting electromagnetic radiation in said surface layer;
attaching said first substrate to a second substrate, said surface layer being on said second substrate;
providing markers in or on said second substrate thereby ensuring that said markers are aligned with the devices of said array;
providing electrical connections to said array of devices, preferably thereby ensuring that essentially each of said devices are addressed individually.

40. A method of fabricating an optoelectrical apparatus comprising the steps of:
growing a surface layer on a first substrate;
attaching said first substrate to a second substrate, said surface layer being on said second substrate;
providing an array of devices for emitting and/or detecting electromagnetic radiation in said surface layer;
providing markers in or on said second substrate thereby ensuring that said markers are aligned with the devices of said array; and
providing electrical connections to said array of devices, preferably thereby ensuring that essentially each of said devices are addressed individually.

* * * * *

UNITED STATES PATENT AND TRADEMARK OFFICE
CERTIFICATE OF CORRECTION

PATENT NO. : 6,318,901 B1
DATED : November 20, 2001
INVENTOR(S) : Paul Heremans et al.

It is certified that error appears in the above-identified patent and that said Letters Patent is hereby corrected as shown below:

Column 1,
Line 5, insert:

-- This application relates to and claims the benefit of priority from U.S. Provisional Application No. 60/110,321 filed on November 30, 1998. --

Signed and Sealed this

Twelfth Day of August, 2003

JAMES E. ROGAN
*Director of the United States Patent and Trademark Office*